United States Patent
Kang et al.

(10) Patent No.: US 9,705,037 B2
(45) Date of Patent: Jul. 11, 2017

(54) LIGHT EMITTING DEVICE, LIGHT EMITTING DEVICE PACKAGE AND LIGHTING SYSTEM INCLUDING THE SAME

(75) Inventors: Jeung Mo Kang, Suwon-si (KR); Du Hyun Kim, Seoul (KR); Jae Wook Kim, Seoul (KR); Jeong Hyeon Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 709 days.

(21) Appl. No.: 12/716,922

(22) Filed: Mar. 3, 2010

(65) Prior Publication Data

US 2010/0224899 A1 Sep. 9, 2010

(30) Foreign Application Priority Data

Mar. 3, 2009 (KR) ........................ 10-2009-0018067

(51) Int. Cl.
*H01L 33/20* (2010.01)
*H01L 33/38* (2010.01)
*H01L 33/14* (2010.01)

(52) U.S. Cl.
CPC .............. *H01L 33/20* (2013.01); *H01L 33/14* (2013.01); *H01L 33/385* (2013.01); *H01L 33/382* (2013.01); *H01L 2224/48091* (2013.01)

(58) Field of Classification Search
CPC ....... H01L 33/007; H01L 33/20; H01L 33/32; H01L 21/02458; H01L 33/385
USPC ..................................... 257/95, 98
See application file for complete search history.

(56) References Cited

U.S. PATENT DOCUMENTS

| 5,309,001 | A | * | 5/1994 | Watanabe et al. | 257/99 |
| 6,225,648 | B1 | | 5/2001 | Hsieh et al. | |
| 7,704,764 | B2 | | 4/2010 | Li et al. | |
| 2001/0013608 | A1 | * | 8/2001 | Kobayashi et al. | 257/88 |
| 2002/0056848 | A1 | | 5/2002 | Wirth | |
| 2003/0112842 | A1 | | 6/2003 | Crawford | |
| 2003/0173568 | A1 | * | 9/2003 | Asakawa | H01L 33/22 257/79 |
| 2004/0094773 | A1 | * | 5/2004 | Kiyoku et al. | 257/103 |
| 2006/0202219 | A1 | | 9/2006 | Ohashi et al. | |
| 2006/0273334 | A1 | | 12/2006 | Nagai et al. | |
| 2007/0096110 | A1 | * | 5/2007 | Kato et al. | 257/79 |
| 2007/0096116 | A1 | * | 5/2007 | Yasuda et al. | 257/79 |
| 2007/0202624 | A1 | * | 8/2007 | Yoon et al. | 438/29 |
| 2008/0093612 | A1 | | 4/2008 | Konno et al. | |

(Continued)

FOREIGN PATENT DOCUMENTS

CN 1763983 A 4/2006
CN 101241958 A 8/2008

(Continued)

*Primary Examiner* — Thao X Le
*Assistant Examiner* — Geoffrey Ida
(74) *Attorney, Agent, or Firm* — Birch, Stewart, Kolasch & Birch, LLP (57) ABSTRACT

Provided are a light emitting device, a light emitting device package and a lighting system including the same. The light emitting device (LED) comprises a substrate, a 5 second conductive type semiconductor layer, an active layer, a first conductive type semiconductor layer and a first electrode. The vertical distances between the first conductive type semiconductor layer and the second conductive type semiconductor layer are varied.

16 Claims, 8 Drawing Sheets

(56) References Cited

U.S. PATENT DOCUMENTS

| | | |
|---|---|---|
| 2008/0111139 A1 | 5/2008 | Chae et al. |
| 2008/0273562 A1 | 11/2008 | Hasegawa et al. |
| 2009/0092165 A1* | 4/2009 | Sakai .......................... 372/46.01 |
| 2009/0146168 A1 | 6/2009 | Kwon et al. |
| 2010/0012969 A1 | 1/2010 | Yoon et al. |
| 2010/0065869 A1* | 3/2010 | Arai et al. ...................... 257/98 |
| 2010/0230714 A1* | 9/2010 | Shinohara et al. ........... 257/103 |
| 2010/0314642 A1 | 12/2010 | Kudo et al. |

FOREIGN PATENT DOCUMENTS

| | | |
|---|---|---|
| CN | 101241959 A | 8/2008 |
| CN | 101355118 A | 1/2009 |
| DE | 199 37 624 A1 | 3/2001 |
| EP | 1 724 845 A2 | 11/2006 |
| EP | 2003705 A1 | 12/2008 |
| JP | 58-40872 A | 3/1983 |
| JP | 62-139365 A | 6/1987 |
| JP | 2003-258301 A | 9/2003 |
| JP | 2004-111493 A | 4/2004 |
| JP | 2005-347492 A | 12/2005 |
| JP | 2007-042857 A | 2/2007 |
| JP | 2007-112633 A | 5/2007 |
| JP | 2007-123517 A | 5/2007 |
| JP | 2008-103627 A | 5/2008 |
| JP | 2008-160063 A | 7/2008 |
| JP | 2008-288572 A | 11/2008 |
| KR | 10-2007-0080435 A | 8/2007 |
| KR | 10-2008-0061697 A | 7/2008 |
| KR | 10-2008-0089880 A | 10/2008 |
| WO | WO 2007/123289 A1 | 11/2007 |

* cited by examiner

LIGHT EMITTING DEVICE, LIGHT EMITTING DEVICE PACKAGE AND LIGHTING SYSTEM INCLUDING THE SAME

CROSS-REFERENCE TO RELATED APPLICATIONS

This application claims under 35 U.S.C. §119 to Korean Patent Application No. 10-2009-0018067, filed Mar. 3, 2009, which is hereby incorporated by reference in its entirety.

BACKGROUND

Embodiments relate to a light emitting device, a light emitting device package and a lighting system including the same.

Nitride semiconductors are attracting much attention for the fields of optical devices and high-power electronic devices because of their high thermal stability and wide band gap energy. In particular, blue light emitting devices (LEDs), green LEDs, and UV LEDs that use nitride semiconductors have been commercialized and are being widely used.

In recently, LEDs are used as light sources of display devices, indoor and outdoor lightings, and vehicle head lamps. It is necessary to improve an optical power of the LEDs to apply the LEDs to various high-power electronic devices.

According to a related art LED, injected electrons and holes are not uniformly supplied within an LED, but concentrately supplied to a specific portion or recombined with each other. Thus, current is not smoothly supplied to the other portion to cause current crowding.

The partial concentration of the current may apply a large stress to the LED as well as deteriorate light emission uniformity. The current crowding may cause serious limitations as a supply amount of the current increases. That is, when current above a predetermined level is applied, light efficiency is not constantly maintained, but reduced. A relation between the applied current and an optical power does not linearly increase. As a large amount of current is applied more and more, a further large amount of heat is generated. When the further large amount of the heat is partially generated, performance and life cycle of the LED may be degraded. Also, such phenomenon may get worse because large-sized LED or a high-power LED is operated under high current.

SUMMARY

Embodiments provide a light emitting device that can prevent current crowding and improve light extraction efficiency, a light emitting device package and a lighting system including the same.

In one embodiment, a light emitting device (LED) comprises: a substrate; a second conductive type semiconductor layer on the substrate; an active layer on the second conductive type semiconductor layer; a first conductive type semiconductor layer on the active layer; and, a first electrode on the first conductive type semiconductor layer, wherein the vertical distances between the first conductive type semiconductor layer and the second conductive type semiconductor layer are varied.

In another embodiment, a light emitting device (LED) comprises: a first conductive type semiconductor layer, a second conductive type semiconductor layer, and an active layer between the first conductive type semiconductor layer and the second conductive type semiconductor layer; a conductive substrate comprising at least one step over the first conductive type semiconductor layer; and a first electrode over the conductive substrate.

In further another embodiment, a light emitting device (LED) package comprises: a LED comprising a substrate, a second conductive type semiconductor layer on the substrate, an active layer on the second conductive type semiconductor layer, a first conductive type semiconductor layer on the active layer and, a first electrode on the first conductive type semiconductor layer, wherein the vertical distances between the first conductive type semiconductor layer and the second conductive type semiconductor layer are varied; and a package body comprising the LED.

In still further another embodiment, a light emitting device (LED) package comprises: a first conductive type semiconductor layer, a second conductive type semiconductor layer, and an active layer between the first conductive type semiconductor layer and the second conductive type semiconductor layer, a conductive substrate comprising at least one step over the first conductive type semiconductor layer and a first electrode over the conductive substrate; and a package body comprising the LED.

In even further other embodiment, a lighting system comprises a light emitting module including a light emitting device (LED) package: the LED package comprising a LED comprising a substrate, a second conductive type semiconductor layer on the substrate, an active layer on the second conductive type semiconductor layer, a first conductive type semiconductor layer on the active layer and, a first electrode on the first conductive type semiconductor layer, wherein the vertical distances between the first conductive type semiconductor layer and the second conductive type semiconductor layer are varied; and a package body comprising the LED.

In even further other embodiment, a lighting system comprises a light emitting module including a light emitting device (LED) package: the LED package comprising a LED including a first conductive type semiconductor layer, a second conductive type semiconductor layer, and an active layer between the first conductive type semiconductor layer and the second conductive type semiconductor layer, a conductive substrate comprising at least one step over the first conductive type semiconductor layer and a first electrode over the conductive substrate; and a package body comprising the LED.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package and a lighting system including the same will be described with reference to accompanying drawings.

In the descriptions of embodiments, it will be understood that when a layer (or film) is referred to as being on another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
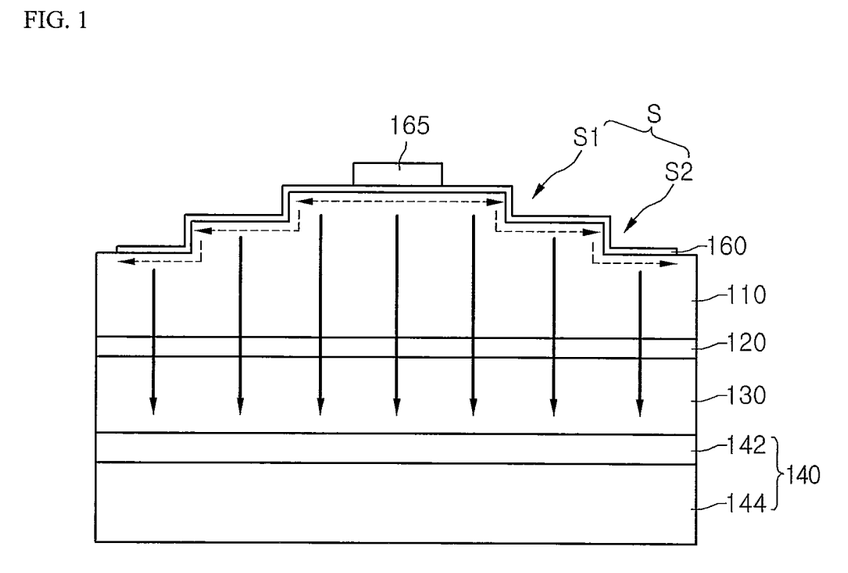
FIG. 1 is a sectional view of a light emitting device (LED) according to a first embodiment.
Figure 2:
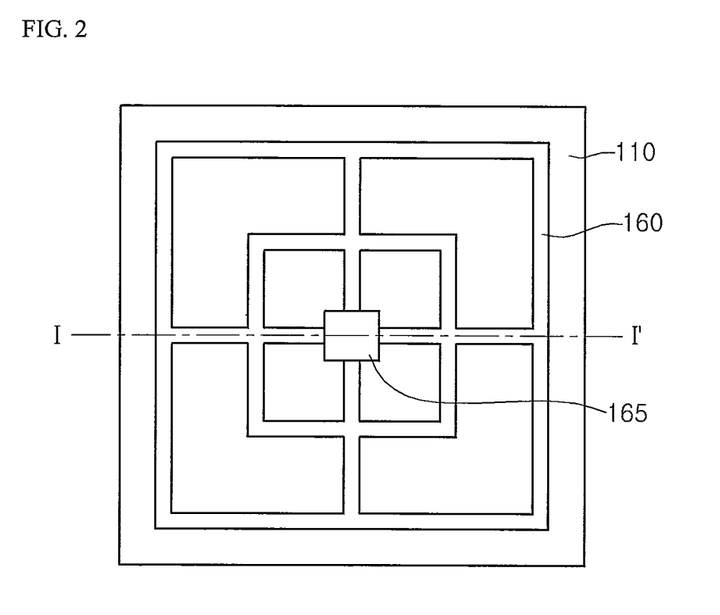
FIG. 2 is a plan view of the LED according to the first embodiment.
Figure 3:
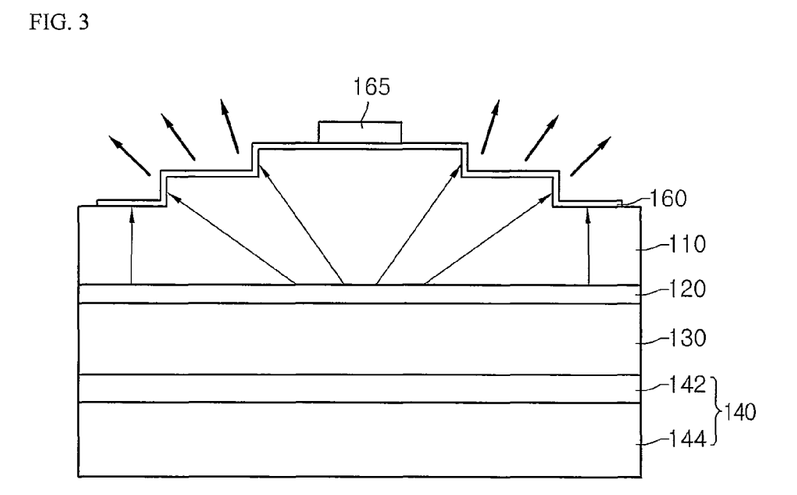
FIG. 3 is a conceptual view illustrating light extraction efficiency due to a step introduction in the LED according to the first embodiment.

FIG. 1 is a sectional view of a light emitting device (LED) according to a first embodiment, and FIG. 2 is a plan view of the LED according to the first embodiment. FIG. 3 is a conceptual view illustrating light extraction efficiency due to a step introduction in the LED according to the first embodiment.

An LED according to a first embodiment may include a second conductive type semiconductor layer 130, an active layer 120. Also, the LED may further include a first conductive type semiconductor layer 110 having a step S on the active layer 120.

According to the LED of the first embodiment, in a vertical type LED, a step may be introduced to first or second conductive type semiconductor layer structures or a conductive substrate to relieve current crowding and improve upper light extraction efficiency.

In a related art, a reason in which the current crowding occurs is because paths through which electrons injected from an n-electrode pad of a central portion pass through an active layer are different from each other. That is, since current vertically flows from the n-electrode pad having a relative short path and a low resistance to a p-electrode, the current is concentrated below the n-electrode pad. On the other hand, since the current usually flow in vertical and horizontal directions at the outside of the n-electrode pad, current flow path is relatively longer and an additional resistance occurs in the horizontal direction. Thus, the current is not smoothly spread.

Since the path in the vertical direction is relatively short when compared to the path in the horizontal direction, almost current actually flows in the vertical direction. Thus, since a small amount of the current flows toward the outside and a large amount of the current flows toward a central portion, the current crowding occurs.

In this embodiment, to solve the limitation of the related art, a stair-shaped step structure is introduced to the first conductive type semiconductor layer, e.g., an n-type GaN layer to lengthen a path of the current flowing into the central portion and shorten a path of the current flowing into the outside.

As a result, since the current flowing from the n-electrode pad to the p-electrode has an actually uniform effective path length, the current crowding may be improved in the overall LED by offsetting an effect due to the horizontally flowing current.

For example, since a distance between a region in which a first pad 165 is disposed and the active layer 120 is longer than that between a region in which the first pad 165 is not disposed and the active layer 120, a carrier-movement distance may be lengthened below the first pad 165 to prevent the current from being concentrated below the first pad 165.

In this embodiment, an etching process may be partially and repeatedly performed to form the stair-shaped step disposed on the n-type GaN layer. Here, a depth of the step may be controlled.

Since the effective path length of the current is varied by an actual length and breadth size of the LED, the stair-shaped step disposed on the n-type GaN layer may be optimized by the length and breadth size of the LED.

That is, when the LED is large-sized and driving current increases, the depth of the step is adjusted to uniformly make effective path of the current. As a result, the same effect may be expected regardless of the size of the LED or the driving current.

Also, as shown in FIG. 3, an amount of light extracted to an upper side may increase. That is, the stair-shaped step disposed on the n-type GaN layer may have a light emitting area increasing by a stepped portion when compared to a structure in which the step is not provided. Thus, an actual upper area may increase to emit a very large amount of light to the upper side.

Also, in case where the step is not provided, light introduced into the LED is total reflected. At this time, in this embodiment, since the step is formed to change a light incident angle, the light is not total reflected, but extracted to the outside. Thus, when compared to the structure in which the step is not provided, this embodiment may reduce the total-reflection light to resultantly contribute to the light extraction. Thus, an amount of the light extracted to the upper side may increase by the above-described two effects.

FIG. 2 illustrates a plan view of the LED according to the first embodiment. The first electrode 160 disposed on the stair-shaped step of the first conductive type semiconductor layer 110 may be designed to have various shapes. FIG. 2 illustrates an example of the first electrode 160. Here, although the first electrode 160 has a square shape surrounding the first pad 165, this embodiment is not limited thereto. For example, the first electrode 160 may have various shapes such as a circular shape or a comb-tooth shape. As shown in FIG. 2, to maximize the effects proposed in this embodiment, a portion of the first electrode 160 may include a portion at which the step is disposed.

Hereinafter, a method of manufacturing the LED according to the first embodiment will be described with reference to FIGS. 4 to 8.

Figure 4:
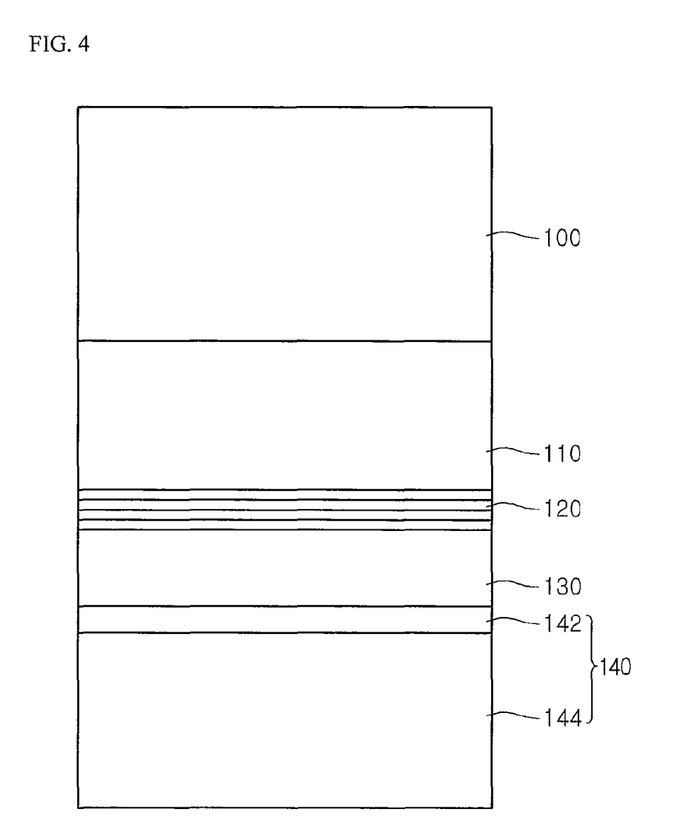
FIGS. 4 to 8 are sectional views illustrating a process of manufacturing the LED according to the first embodiment.

As shown in FIG. 4, a first substrate 100 is prepared. The first substrate 100 may be a sapphire substrate or a SiC substrate, but is not limited thereto. A wet etching process may be performed on the first substrate 100 to remove impurities on a surface of the first substrate 100.

Thereafter, a first conductive type semiconductor layer 110 is formed on the first substrate 100. For example, an n-type GaN layer of the first conductive type semiconductor layer 110 may be formed by using a chemical vapor deposition (CVD) process, a molecular beam epitaxy (MBE) process, a sputtering process, or a hydride vapor phase epitaxial (HYPE) deposition process. Also, silane gas ($SiH_4$) containing N-type impurities such as trimethylgallium gas (TMGa), ammonia gas ($NH_3$), nitrogen gas ($N_2$), hydrogen gas ($H_2$), and silicon (Si) may be injected into a chamber to form the first conductive type semiconductor layer 110.

The first conductive type semiconductor layer 110 may be formed of one or more of GaN, InN, AlN, InGaN, AlGaN, InAlGaN, AlInN, AlGaAs, AlInGaAs, GaP, AlGaP, InGaP, AlInGaP, and InP.

An active layer 120 is formed on the first conductive type semiconductor layer 110. The active layer 120 serves as a layer in which electrons injected through the first conductive type semiconductor layer 110 recombine with electron holes injected through a second conductive type semiconductor layer 130 to emit light having an energy determined by a proper energy band of an active layer (light emitting layer) material.

The active layer 120 may have at least one structure of a single quantum-well structure, a multi quantum-well structure, a quantum-wire structure, and a quantum dot structure. For example, in the active layer 120, trimethyl gallium (TMGa) gas, ammonia (NH3) gas, nitrogen (N2) gas, and trimethyl indium (TMIn) gas are injected to form the multi-quantum well structure, but is not limited thereto. The active layer 120 may have one or more structures of an InGaN/GaN structure, an InGaN/InGaN structure, an AlGaN/GaN structure, an InAlGaN/GaN structure, a GaAs/AlGaAs(InGaAs) structure, and a GaP/AlGaP(InGaP) structure.

Thereafter, a second conductive type semiconductor layer 130 is formed on the active layer 120. For example, bis (ethylcyclopentadienyl) magnesium ($EtC_{p2}Mg$){Mg $(C_2H_5C_5H_4)_2$} containing p-type impurities such as trimethyl gallium (TMGa) gas, ammonia ($NH_3$) gas, nitrogen ($N_2$) gas, and magnesium (Mg) may be injected into the chamber to form a p-type GaN layer of the second conductive type semiconductor layer 130, but is not limited thereto.

A second electrode layer 140 may be formed on the second conductive type semiconductor layer 130. The second electrode layer 140 may include an ohmic layer 142, a reflective layer (not shown), an adhesive layer (not shown), and a second substrate 144.

For example, the second electrode layer 140 may include the ohmic layer 142. At this time, a single metal or a metal alloy may be multi-stacked to improve the efficiency of electron hole injection. The ohmic layer may be formed of at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au, Ni/IrOx/Au/ITO, Ni, Pt, Cr, Ti, and Ag, but is not limited thereto.

According to this embodiment, the second electrode layer 140 may include a metal layer containing Al, Ag, or an alloy containing Al or Ag. The material such as Al or Ag may effectively reflect light generated at the active layer to improve light extraction efficiency of the LED.

Also, when the second electrode layer 140 includes an adhesive layer, the reflective layer may serve as the adhesive layer, or the adhesive layer may be formed using Ni or Au.

The second electrode layer 140 may include a second substrate 144. The second substrate 144 may be formed of a metal having good conductive properties, a metal alloy, or a conductive semiconductor material to efficiently inject the electron holes. For example, the second substrate 144 may be formed of one of more of copper (Cu), a Cu alloy, Si, molybdenum (Mo), SiGe, Ge, GaN, and SiC. The second substrate 144 may be formed using an electrochemical metal deposition method or a bonding method using eutectic metals.

Figure 5:
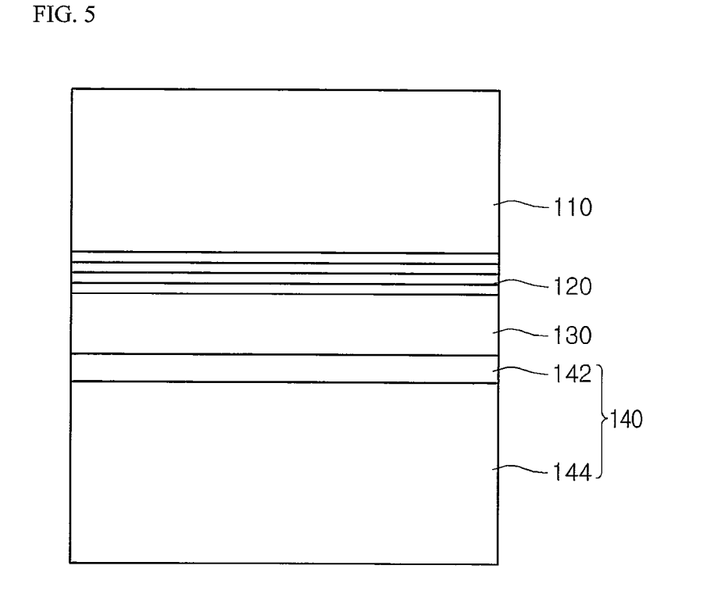

As shown in FIG. 5, the first substrate 100 is removed to expose the first conductive type semiconductor layer 110. The first substrate 100 may be separated by using a high power laser or removed by using a chemical etching process. Also, the first substrate 100 may be removed by being physically grinded. The exposed first conductive type semiconductor layer 110 may include a surface defective layer generated when the first substrate 100 is removed. The surface defective layer may be removed using a wet or dry etching process.

Figure 6:
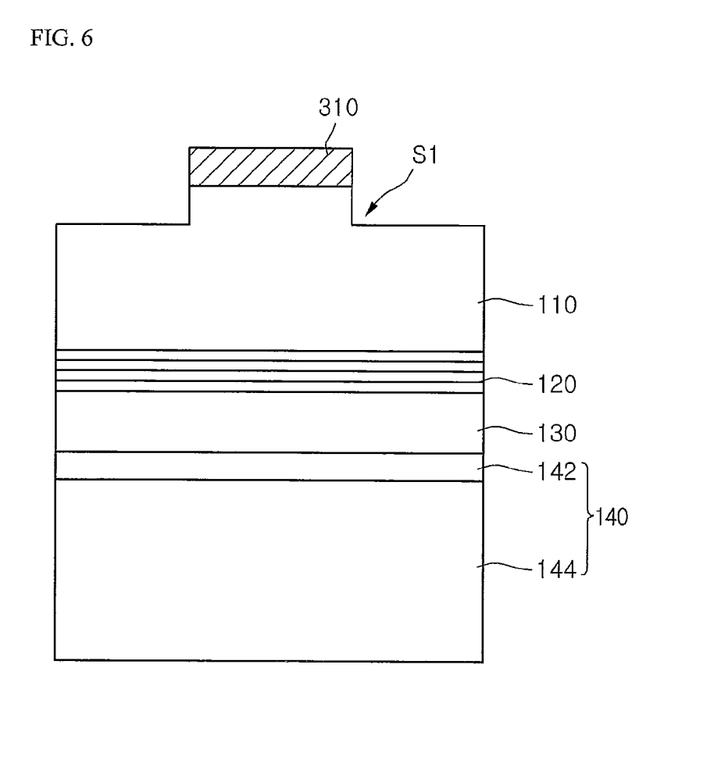

As shown in FIG. 6, a step is formed on the exposed first conductive type semiconductor layer 110. For example, a first pattern 310 may be formed on the exposed first conductive type semiconductor layer 110, and an etching process may be performed on the first conductive type semiconductor layer 110 using the first pattern 310 as an etch mask to form a first step S1. For example, a first photoresist pattern 310 may be formed in a region in which a first pad 165 will be formed later, and an etching process may be partially performed on the first conductive type semiconductor layer 110 using the first photoresist pattern as an etch mask to form the first step S1.

Figure 7:
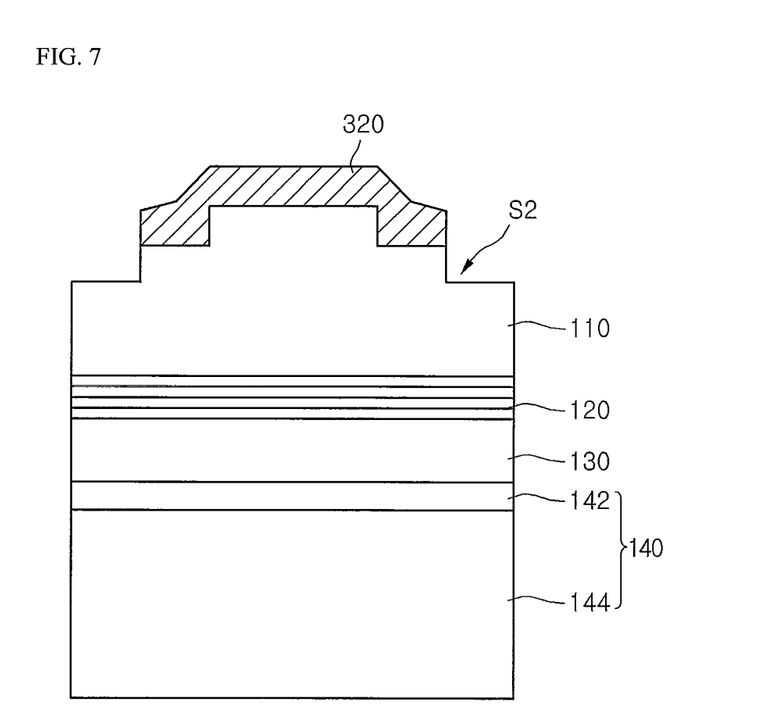

As shown in FIG. 7, the first pattern 310 may be removed, and a second pattern 320 having a width greater than that of the first pattern 310 may be formed to form a second step S2.

For example, the first pattern may be removed using an ashing process. The second pattern 320 having the width greater than that of the first pattern 310 may be formed using a photoresist. Then, the first conductive type semiconductor layer 110 may be etched using the second pattern 320 as an etch mask to form the second step S2.

Figure 8:
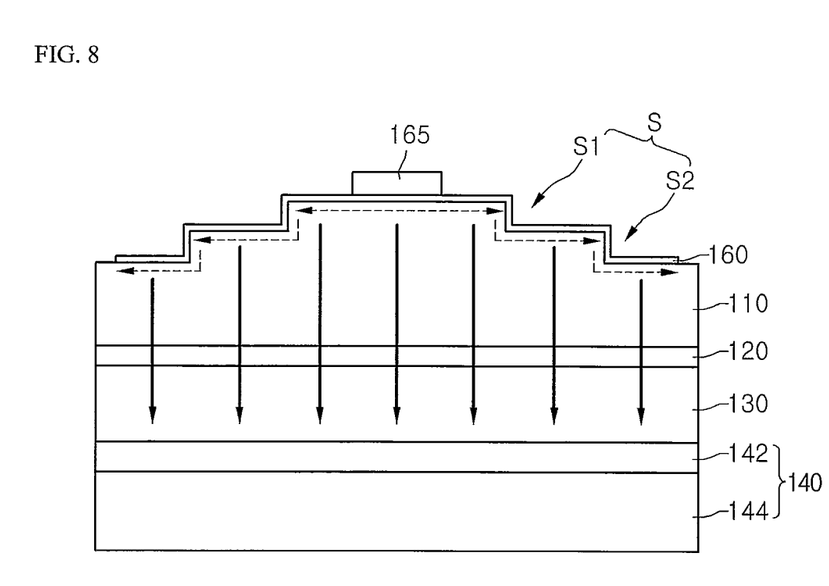

As shown in FIG. 8, a first electrode 160 is formed on the first conductive type semiconductor layer 110 including the step S. The first electrode 160 may be a transparent electrode.

In this embodiment, the first electrode 160 having various shapes may be formed on the first conductive type semiconductor layer 110 including the step S.

For example, as shown in FIG. 2, the first electrode 160 disposed on the stair-shaped step of the first conductive type semiconductor layer 110 may be designed to have various shapes. Here, although the first electrode 160 has a square shape surrounding the first pad 165, this embodiment is not limited thereto. For example, the first electrode 160 may have various shapes such as a circular shape or a comb-tooth shape. As shown in FIG. 2, to maximize the effects proposed in this embodiment, a portion of the first electrode 160 may include a portion at which the step is disposed.

The first pad 165 is formed on the first electrode 160.

According to the LED of the first embodiment, in a vertical type LED, the step may be introduced to first or second conductive type semiconductor layer structures to relieve current crowding and improve upper light extraction efficiency.

Figure 9:
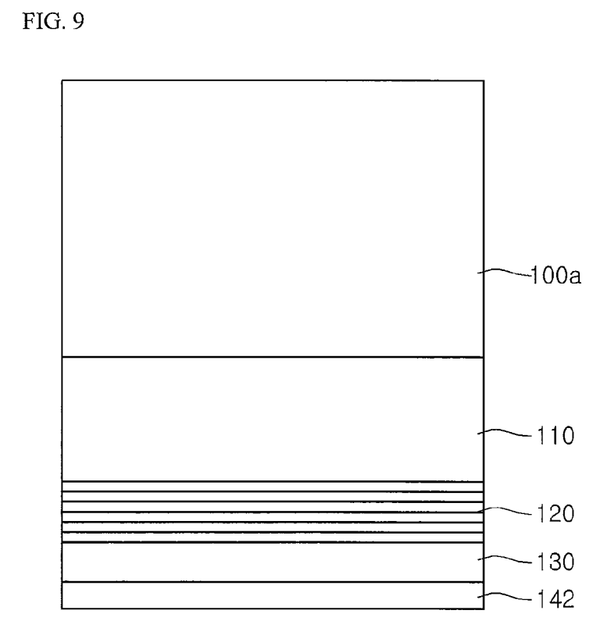
FIGS. 9 and 10 are sectional views of an LED according to a second embodiment.
Figure 10:
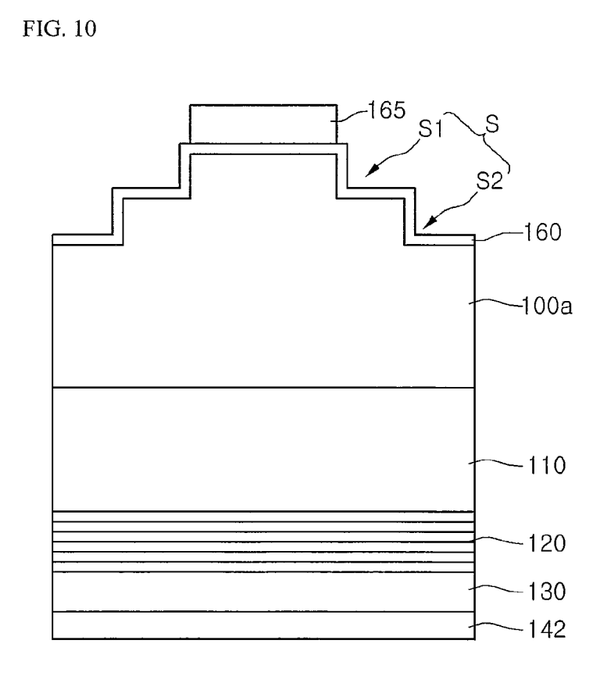

FIGS. 9 and 10 are sectional views of an LED according to a second embodiment. The second embodiment may adopt the technical features of the first embodiment.

Unlike the first embodiment, in the second embodiment, a semiconductor layer may be formed on a conductive substrate 100a, and a step S may be formed on the conductive substrate 100a. Hereinafter, features of the second embodiment may be mainly described.

As shown in FIG. 9, the conductive substrate 100a is prepared. The conductive substrate 100a is high in electric conductivity and is transparent in the range of visible rays. The conductive substrate 100a may be a single crystal substrate formed of gallium nitride (e.g., GaN), gallium oxide (e.g., $Ga_2O_3$), zinc oxide (ZnO), silicon carbide (SiC), or metal oxide.

Like the first embodiment, a first conductivity type semiconductor layer 110, an active layer 120, and a second conductivity type semiconductor layer 140 are formed on the conductive substrate 100a.

A portion of the bottom of the conductive substrate 100a is removed. For example, a polishing process may be performed to reduce the thickness of the bottom layer of the conductive substrate 100a. The thickness of the conductive substrate 100a after the polishing process may vary according to the application product of a desired device. For example, the conductive substrate 100a with a thickness of about 400 μm to about 500 μm is polished to a thickness of about 70 μm to about 100 μm, to which the embodiment is not limited.

When a nitride semiconductor thin layer is formed on the conductive substrate 100a at high temperatures by means of thin layer growth equipment, the surface crystal quality of the bottom surface of the conductive substrate 100a may degrade due to high thin layer growth temperatures and reactive gases. Thus, polishing the bottom layer of the conductive substrate 100a can improve the electrical characteristics of the device.

As shown in FIG. 10, a step S may be formed on the conductive substrate 100a. A method of forming the step S may adopt that of the first embodiment.

A first electrode 160 may be formed on the conductive substrate 100a including the step S, and a first pad 165 may be formed on the first electrode 160.

According to the LED of the this embodiment, in a vertical type LED, the step may be introduced to first or second conductive type semiconductor layer structures or the conductive substrate to relieve current crowding and improve upper light extraction efficiency.

Figure 11:
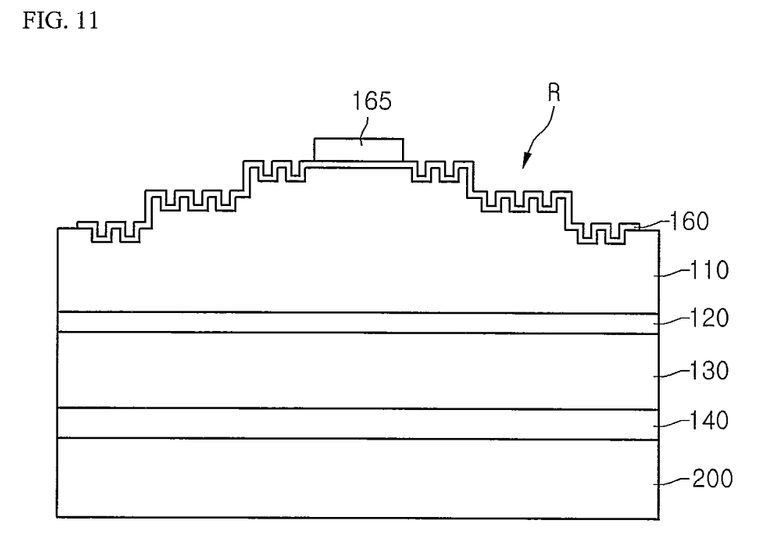
FIG. 11 is a sectional view of an LED according to a third embodiment.

FIG. 11 is a sectional view of an LED according to a third embodiment.

A third embodiment may adopt the technical features of the first or second embodiment.

In an LED according to the third embodiment, a light extraction structure R may be disposed on an upper portion of a light emitting structure to further improve light extraction efficiency. For example, a roughness may be disposed on a first conductive type semiconductor layer 110 to form the light extraction structure R, but is not limited thereto.

For example, the light extraction structure R can be formed by patterning or can be a roughness formed by a wet etching.

The light extraction structure R can be formed only on the light emitting structure where the electrode pad 165 is not formed.

Figure 12:
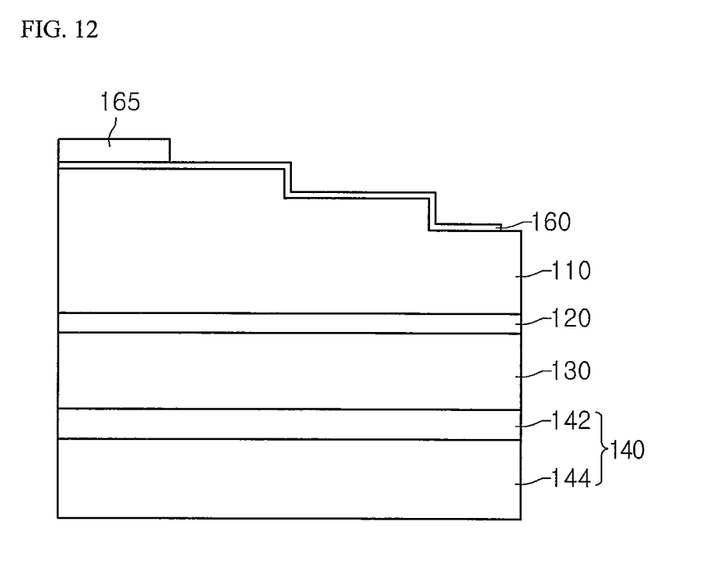
FIG. 12 is a sectional view of an LED according to a fourth embodiment.

FIG. 12 is a sectional view of an LED according to a fourth embodiment.

A fourth embodiment may adopt the technical features of the first, second, and third embodiments.

In the fourth embodiment, a first pad 165 may be disposed on an edge of a top surface of an LED.

According to the fourth embodiment, since a distance between a region in which the first pad 165 is disposed and an active layer is longer than that between a region in which the first pad 165 is not disposed and the active layer, a carrier-movement distance may be lengthened below the first pad 165 to prevent the current from being concentrated below the first pad 165.

In another embodiment, a step can be formed under the LED.

For example, an area of the second electrode layer 140 corresponding to the electrode pad 165 can be formed lower than the other area of the second electrode layer 140, thereby current spreading can be prevented.

Also, in another embodiment, the step can be formed both upper and under the LED.

Also, the shape of the step can have a stair shape but, this embodiment is not limited thereto. For example, the step can be less 90° or the step can have a hemispherical upper portion.

Figure 13:
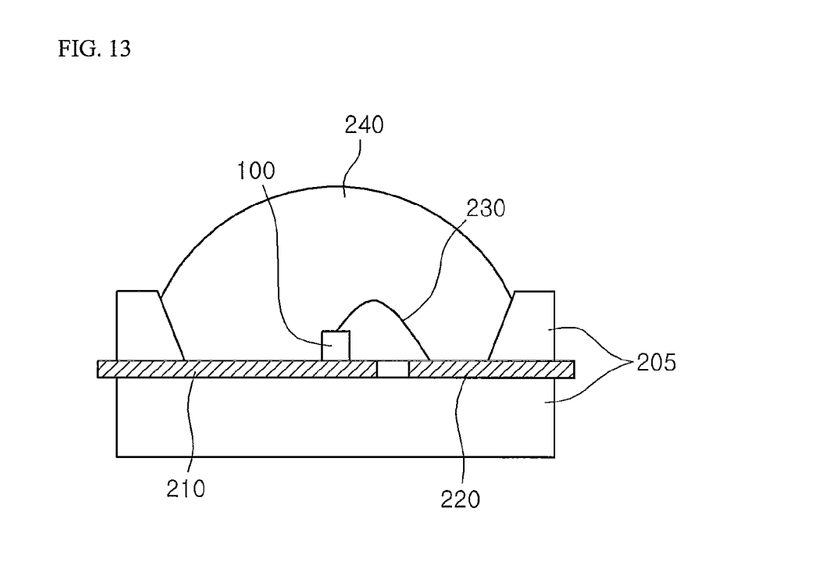
FIG. 13 is a sectional view of an LED package according to an embodiment.

FIG. 13 is a sectional view of an LED package including an LED according to an embodiment.

Referring to FIG. 13, an LED package according to an embodiment includes a body 205, a third electrode layer 210 and a fourth electrode layer 220 disposed in the body 205, an LED 100 disposed in the body 205 and electrically connected to the third electrode layer 210 and the fourth electrode layer 220, and a molding member 240 surrounding the LED 100.

The body 205 may be formed of a silicon material, a synthetic resin material, or a metal material. An inclined surface may be disposed around the LED 100.

The third electrode layer 210 and the fourth electrode layer 220 are electrically separated from each other and supply a power to the LED 100. Also, the third electrode layer 210 and the fourth electrode layer 220 may reflect light generated in the LED 100 to improve light efficiency. In addition, the third electrode layer 210 and the fourth electrode layer 220 may release heat generated in the LED 100 to the outside.

The vertical type LED illustrated in FIG. 1 may be applicable as the LED 100, but is not limited thereto. For example, a lateral type LED may be applicable as the LED 100.

For example, in the lateral type LED, a distance between electrodes are formed is longer than that of between electrodes are not formed, thereby current crowding can be prevented.

The LED 100 may be disposed on the body 205 or on the third electrode layer 210 or the fourth electrode layer 220.

The LED 100 may be electrically connected to the third electrode layer 210 and/or the fourth electrode layer 220 through a wire 300. In this embodiment, the vertical type LED 100 is explained as an example, and one wire 300 may be used as an example, but are not limited thereto.

The molding member 240 may surround the LED 100 to protect the LED 100. Also, a phosphor may be contained in the molding member 240 to vary a wavelength of light emitted from the LED 100.

The LED package according to an embodiment may be applicable to a lighting system. The lighting system may include a lighting unit illustrated in FIG. 14 and a backlight unit illustrated in FIG. 15. In addition, the lighting system may include traffic lights, a vehicle headlight, and a sign.

Figure 14:
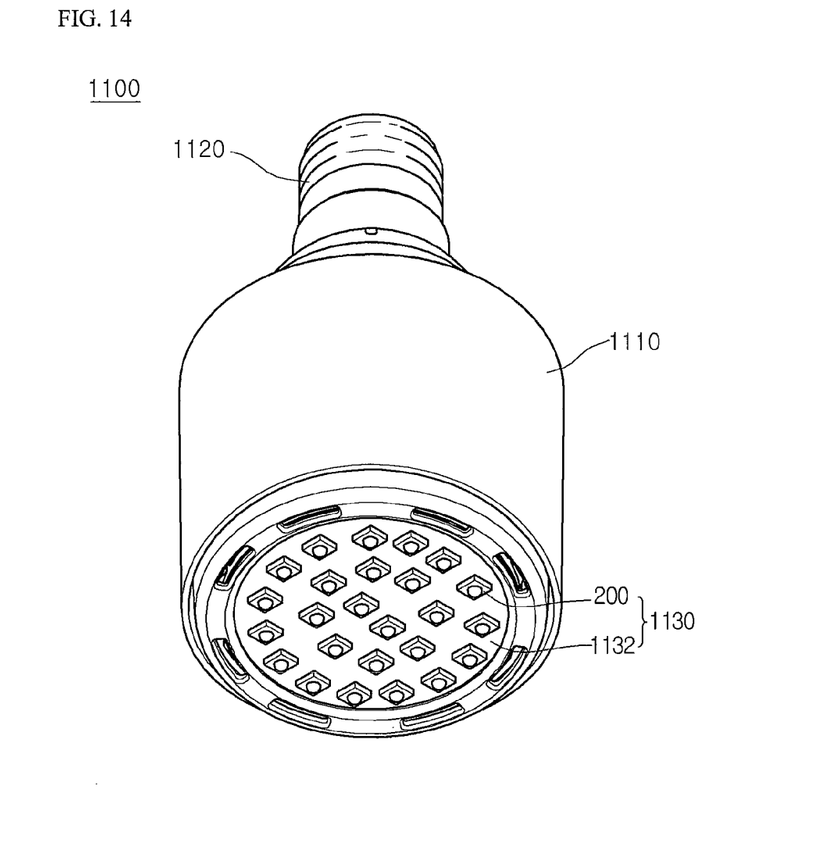
FIG. 14 is a perspective view of a lighting unit according to an embodiment.

FIG. 14 is a perspective view of a lighting unit 1100 according to an embodiment.

Referring to FIG. 14, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The at least one light emitting device package 200 may be mounted on the substrate 1132. The light emitting device package 200 may include at least one light emitting diode 100. The light emitting diode 100 may include a colored light emitting diode that emits red, green, blue, or white light and an UV light emitting diode that emits ultraviolet (UV) light.

The light emitting module 1130 may include a plurality of light emitting device packages 200 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 14, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 15:
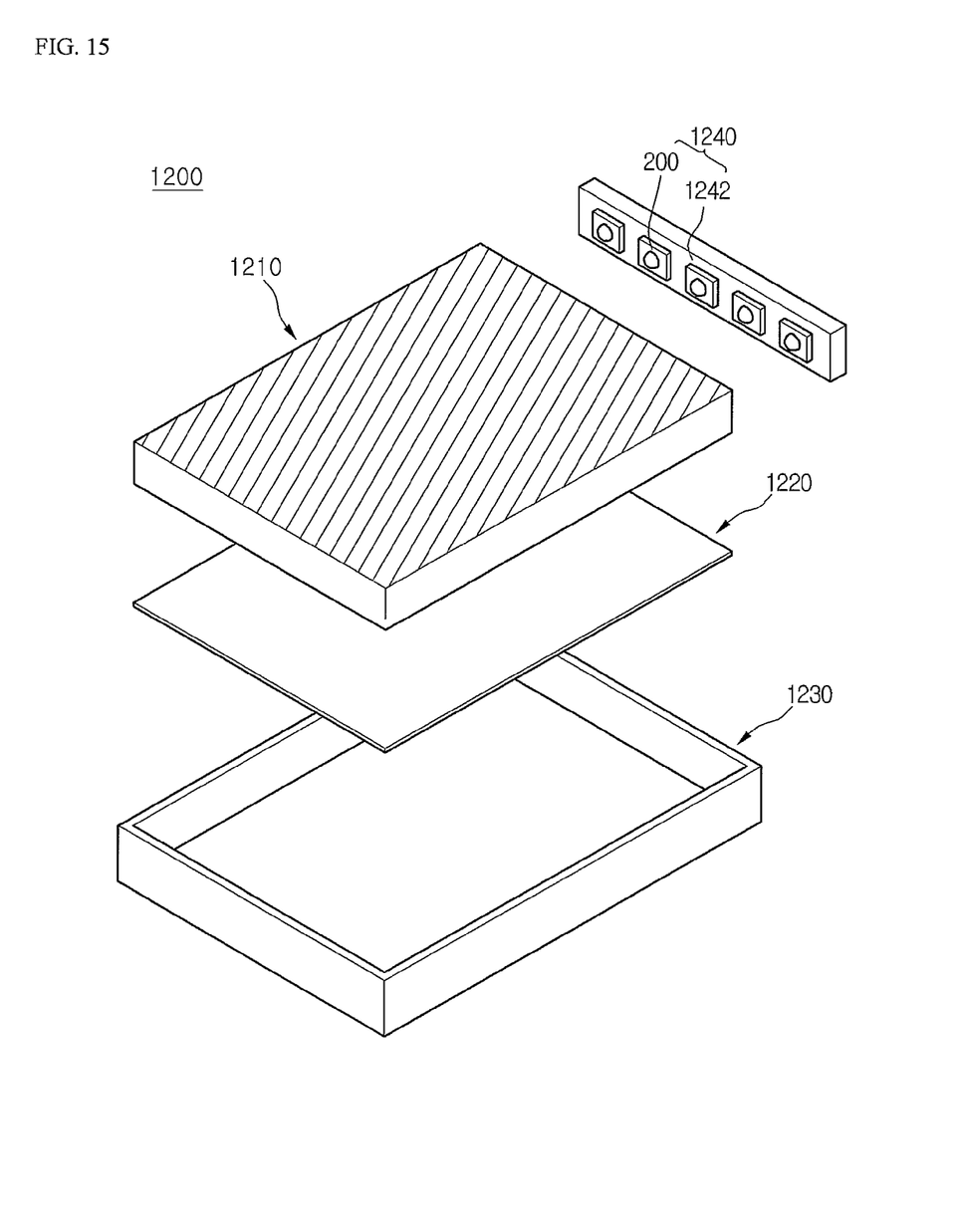
FIG. 15 is an exploded perspective view of a backlight unit according to an embodiment.

FIG. 15 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may provide light the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of light emitting device packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

A light emitting surface of each of the plurality of light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED) comprising:
   a substrate;
   a second conductive type semiconductor layer on the substrate;
   an active layer on the second conductive type semiconductor layer;
   a first conductive type semiconductor layer on the active layer;
   a first electrode on the first conductive type semiconductor layer;
   an electrode pad on the first electrode, the electrode pad having a lower surface; and
   a light extraction structure on the first conductive type semiconductor layer,
   wherein the first conductive type semiconductor layer comprises a top surface including a first surface contacting the first electrode, a second surface and a third surface,
   wherein the second surface is interposed between the first surface and the third surface of the top surface,
   wherein a distance includes a first distance from an interface between the active layer and the first conductive type semiconductor layer to the first surface of the first conductive type semiconductor layer, a second distance from the interface between the active layer and the first conductive type semiconductor layer to the second surface of the first conductive type semiconductor layer, and a third distance from the interface between the active layer and the first conductive type semiconductor layer to the third surface of the first conductive type semiconductor layer, wherein the first distance is greater than the second distance, wherein the second distance is greater than the third distance, wherein the lower surface of the electrode pad contacts the first surface of the first conductive type semiconductor layer, wherein a first width of the first surface of the first conductive type semiconductor layer is larger than the second surface and the third surface of the first conductive type semiconductor layer, wherein the first width of the first surface of the first conductive type semiconductor layer is larger than a width of the lower surface of the electrode pad, wherein an entire bottom surface of the first electrode physically contacts the first surface, the second surface and the third surface of the first conductive type semiconductor layer, wherein the first electrode surrounds the electrode pad, wherein the first electrode comprises a plurality of branch electrodes, wherein the branch electrodes are spaced apart from each other, wherein the first surface, the second surface and the third surface of the first conductive type semiconductor layer are parallel to each other, wherein the first electrode comprises three top surfaces, each having a different height, wherein the three top surfaces of the first electrode are parallel to each other, wherein the light extraction structure is formed by patterning of the first conductive type semiconductor layer, wherein the electrode pad is disposed in the center of the light extraction structure, wherein the light extraction structure is disposed only on the first conductive type semiconductor layer where the electrode pad is not formed, wherein a bottom surface of the electrode pad is higher than a topmost surface of the first conductive type semiconductor layer, and wherein the first conductive type semiconductor layer comprises n-type impurities, and the second conductive type semiconductor layer comprises p-type impurities.

2. The LED of claim 1, wherein the electrode pad is positioned on the light extraction structure.

3. A light emitting device (LED) comprising:
a first conductive type semiconductor layer;
a second conductive type semiconductor layer;
an active layer between the first conductive type semiconductor layer and the second conductive type semiconductor layer;
a first electrode on the first conductive type semiconductor layer;
an electrode pad on the first electrode, the electrode pad having a lower surface; and
a light extraction structure on the first conductive type semiconductor layer, wherein the first conductive type semiconductor layer comprises surfaces a top surface including a first surface contacting the first electrode, a second surface and a third surface, wherein the second surface is interposed between the first surface and the third surface of the top surface, wherein a distance includes a first distance from an interface between the active layer and the first conductive type semiconductor layer to the first surface of the first conductive type semiconductor layer, a second distance from the interface between the active layer and the first conductive type semiconductor layer to the second surface of the first conductive type semiconductor layer, and a third distance from the interface between the active layer and the first conductive type semiconductor layer to the third surface of the first conductive type semiconductor layer, wherein the first distance is greater than the second distance, wherein the second distance is greater than the third distance, wherein the lower surface of the electrode pad contacts the first surface of the first conductive type semiconductor layer, wherein a first width of the first surface of the first conductive type semiconductor layer is larger than the second surface and the third surface of the first conductive type semiconductor layer, wherein the first width of the first surface of the first conductive type semiconductor layer is larger than a width of the lower surface of the electrode pad, wherein an entire bottom surface of the first electrode physically contacts the first surface, the second surface and the third surface of the first conductive type semiconductor layer, wherein the first electrode surrounds the first electrode pad, wherein the first electrode comprises a plurality of branch electrodes, wherein the branch electrodes are spaced apart from each other, wherein the first surface, the second surface and the third surface of the first conductive type semiconductor layer are parallel to each other, wherein the first electrode comprises three top surfaces, each having a different height, wherein the three top surfaces of the first electrode are parallel to each other, wherein the light extraction structure is formed by patterning of the first conductive type semiconductor layer, wherein the electrode pad is disposed in the center of the light extraction structure, wherein the light extraction structure is disposed only on the light emitting structure where the electrode pad is not formed, wherein a bottom surface of the electrode pad is disposed higher than a topmost surface of the first conductive type semiconductor layer, and wherein the first conductive type semiconductor layer comprises n-type impurities, and the second conductive type semiconductor layer comprises p-type impurities.

4. A light emitting device (LED) package comprising:
an LED of claim 1; and
a package body containing the LED.

5. A lighting system comprising a light emitting module including a light emitting device (LED) package of claim 4.

6. A light emitting device (LED) package comprising:
an LED of claim 3; and
a package body containing the LED.

7. A lighting system comprising a light emitting module including a light emitting device (LED) package of claim 6.

8. The LED of claim 1, further comprising a second electrode on a bottom surface of the second conductive type semiconductor layer,
wherein a distance between the first electrode and the second electrode gradually decreases from where the electrode pad is disposed to where the electrode pad is not disposed.

9. The LED of claim 3, further comprising a second electrode on a bottom surface of the second conductive type semiconductor layer,
wherein a distance between the first electrode and the second electrode gradually decreases from where the electrode pad is disposed to where the electrode pad is not disposed.

10. The LED of claim 1, wherein the electrode pad is disposed on a topmost surface of the first electrode.

11. The LED of claim 3, wherein the electrode pad is disposed on a topmost surface of the first electrode.

12. The LED of claim 1, wherein the first electrode physically contact each of the first surface, the second surface and the third surface.

13. The LED of claim 1, wherein the first conductive type semiconductor layer comprises at least two stair-shaped step structures.

14. The LED of claim 1, wherein the first electrode is a square shape surrounding the electrode pad.

15. The LED of claim 1, wherein the light extraction structure is disposed on the first surface, the second surface and the third surface of the first conductive type semiconductor layer.

16. The LED of claim 3, wherein the light extraction structure is disposed on the first surface, the second surface and the third surface of the first conductive type semiconductor layer.

* * * * *